(12) United States Patent
Georget et al.

(10) Patent No.: US 10,788,549 B2
(45) Date of Patent: Sep. 29, 2020

(54) ANTENNA ARRAY, IN PARTICULAR FOR MAGNETIC RESONANCE IMAGING, COMPRISING LINEAR ELECTROMAGNETIC RESONATORS AND AT LEAST ONE DECOUPLING DEVICE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE D'AIX-MARSEILLE, Marseilles (FR)

(72) Inventors: Elodie Georget, Marseilles (FR); Michel Luong, Sceaux (FR); Alexandre Vignaud, Paris (FR); Eric Giacomini, Bretoncelles (FR); Edouard Chazel, Les Ulis (FR); Redha Abdeddaim, Marseilles (FR); Stefan Enoch, Marseilles (FR); Gérard Tayeb, Marseilles (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE D'AIX-MARSEILLE, Marseilles (FR)

( * ) Notice: Subject to any disclaimer, the term of this patent is extended or adjusted under 35 U.S.C. 154(b) by 0 days.

(21) Appl. No.: 16/068,646

(22) PCT Filed: Jan. 5, 2017

(86) PCT No.: PCT/EP2017/050179
§ 371 (c)(1),
(2) Date: Jul. 6, 2018

(87) PCT Pub. No.: WO2017/118684
PCT Pub. Date: Jul. 13, 2017

(65) Prior Publication Data
US 2019/0018090 A1    Jan. 17, 2019

(30) Foreign Application Priority Data

Jan. 8, 2016 (FR) ...................... 16 50147

(51) Int. Cl.
*G01R 33/36* (2006.01)
*H01Q 9/30* (2006.01)
(Continued)

(52) U.S. Cl.
CPC .......... *G01R 33/365* (2013.01); *G01R 33/34* (2013.01); *G01R 33/34046* (2013.01);
(Continued)

(58) Field of Classification Search
CPC . G01R 33/365; G01R 33/34046; G01R 33/34
See application file for complete search history.

(56) References Cited

U.S. PATENT DOCUMENTS 6,198,362 B1 * 3/2001 Harada ................ H05K 1/0231
333/12
9,478,599 B1 * 10/2016 Gubser ................... H01L 28/10
(Continued)

FOREIGN PATENT DOCUMENTS

| EP | 1 269 211 B1 | 2/2007 |
| EP | 2 757 385 A1 | 7/2014 |

(Continued)

OTHER PUBLICATIONS

Lee, et al., "Coupling and Decoupling Theory and Its Application to the MRI Phased Array", Magnetic Resonance Medicine, vol. 48, pp. 203-213, (2002).
(Continued)

*Primary Examiner* — Dominic E Hawkins
(74) *Attorney, Agent, or Firm* — Baker & Hostetler LLP (57) ABSTRACT

An antenna array includes a plurality of linear electromagnetic resonators having longitudinal axes oriented parallel to one another and not aligned, and at least one decoupling device arranged between two the linear electromagnetic resonators, wherein the decoupling device comprises a plurality of open-loop electromagnetic resonators that are matched to a frequency located in the bandwidth of the two the adjacent linear electromagnetic resonators, that are elec-
(Continued)

trically insulated and that are arranged in a plurality of planes that are not parallel to a plane containing the longitudinal axes of the two the linear electromagnetic resonators. Nuclear magnetic resonance imaging apparatus comprising such an antenna array is also provided.

15 Claims, 12 Drawing Sheets

(51) Int. Cl.
  *H01Q 1/52*  (2006.01)
  *G01R 33/34*  (2006.01)
  *H01Q 15/00*  (2006.01)

(52) U.S. Cl.
  CPC ............. *H01Q 1/521* (2013.01); *H01Q 9/30* (2013.01); *H01Q 15/0086* (2013.01)

(56) References Cited

U.S. PATENT DOCUMENTS

| | | | |
|---|---|---|---|
| 2011/0121834 A1* | 5/2011 | Soutome | G01R 33/365 324/318 |
| 2011/0312499 A1 | 12/2011 | Vaughan et al. | |
| 2013/0271144 A1 | 10/2013 | Avdievich et al. | |
| 2014/0152523 A1* | 6/2014 | Wu | H01Q 1/523 343/841 |
| 2015/0355297 A1* | 12/2015 | Menon | G01R 33/365 324/322 |
| 2015/0369886 A1* | 12/2015 | Menon | G01R 33/365 324/322 |

FOREIGN PATENT DOCUMENTS

| | | |
|---|---|---|
| WO | 2011/098713 A1 | 8/2011 |
| WO | 2014/109757 A1 | 7/2014 |

OTHER PUBLICATIONS

Yan, et al., "Decoupling and Matching Network for Monopole Antenna Arrays in Ultrahigh Field MRI", Quantitative imaging in medicine and surgery, 5(4), pp. 546-551, (2015).
Ferrer, et al., "Decorrelation of Two Closely Spaced Antennas with a Metamaterial AMC Surface", Microwave and optical technology letters, Vo. 50, No. 5, pp. 1414-1417, (2008).
Connel, et al., "MRI RF Array Decoupling Method With Magnetic Wall Distributed Filters", IEEE Transactions on Medical Imaging, vol. 34, No. 4, pp. 825-835, (2015).
Connel, et al., "Design of a Parallel Transmit Head Coil at 7T With Magnetic Wall Distributed Filters", IEEE Transactions on Medical Imaging, vol. 34, No. 4, pp. 836-845, (2015).
Soutome et al., "Vertical Loop Decoupling Method for Gapped Phased-Array Coils", Proc. Intl. Soc. Mag. Reson. Med. 19, p. 1859, (2011).
Avdievich, et al., "Resonant Inductive Decoupling (RID) for Transceiver Arrays to Compensate for both Reactive and Resistive Components of the Mutual Impedance", NMR Biomed., vol. 26, No. 11, pp. 1547-1554, Nov. 18, 2013.

* cited by examiner

ANTENNA ARRAY, IN PARTICULAR FOR MAGNETIC RESONANCE IMAGING, COMPRISING LINEAR ELECTROMAGNETIC RESONATORS AND AT LEAST ONE DECOUPLING DEVICE

CROSS-REFERENCE TO RELATED APPLICATIONS

This application is a National Stage of International patent application PCT/EP2017/050179, filed on Jan. 5, 2017, which claims priority to foreign French patent application No. FR 1650147, filed on Jan. 8, 2016, the disclosures of which are incorporated by reference in their entirety.

FIELD OF THE INVENTION

The invention relates to an antenna array comprising a plurality of electromagnetic resonators.

BACKGROUND

More particularly, the invention applies to the production of multiple-channel high-frequency antennas ("RF coils") and to their use in magnetic resonance imaging (MRI) apparatuses for capturing images of humans or animals. Even more particularly, it applies to the production of high-frequency antennas for high-field MRI, i.e. MRI using a static magnetic field $B_0$ of strength higher than or equal to 3 T (teslas). The invention is not however limited to this single application.

In magnetic resonance imaging, an antenna is used in transmission to generate a radiofrequency field having a magnetic component capable of exciting the spins of the nuclei of atoms, in particular those of hydrogen (for what is called proton MRI) within a sample placed in the antenna. During the phenomenon of relaxation, a radiofrequency signal of very low amplitude is reemitted by the sample. It may then be detected either by the same antenna switched, at that point in time, to a reception chain equipped with very-low-noise amplifiers, or by another dedicated antenna. The static magnetic field, called $B_0$, in which the sample is immersed determines the frequency of the signal, which is proportional thereto. Thus, it passes from 64 MHz to 128 MHz for a field $B_0$ of 1.5 and 3 teslas, respectively.

In the MRI scanners called high-field scanners, i.e. in scanners the field $B_0$ of which exceeds 3 teslas, an antenna is generally composed of a plurality of resonators that are arrayed in order to obtain, on the one hand, a uniform excitation by way of the multi-transmit method, and on the other hand, a higher reception sensitivity, which improves the quality of the image. These resonators transmit and receive the radiofrequency signals.

The operation of high-field MRI antennas is characterized by an inhomogeneity in the radiofrequency magnetic fields emitted or perceived by a single resonator: $B_1^+$ in transmission and $B_1^-$ in reception. The quantity $B_1^+$ corresponds to the circular polarization of the magnetic field rotating in the same direction as the nuclear spins used for the imaging. In contrast, the quantity $B_1^-$ is the polarisation that rotates in the opposite direction and that characterizes the reception sensitivity. The inhomogeneity of the magnetic fields is inherent to the equations of electromagnetism. It increases with the frequency of the signal and therefore with the magnetic field $B_0$. In transmission, the inhomogeneity $B_1^+$ results, in an image, in the appearance of shadowy regions or regions of artificial contrast, which are difficult to interpret. To remedy this, an antenna array formed by a plurality of resonators must be used, either to increase the uniformity of $B_1^+$ directly, or to increase the uniformity of the flip angle. The effectiveness of this compensation increases with the number of resonators in an antenna array.

In reception, a larger number of resonators will deliver a more uniform overall reception profile, with an increased signal-to-noise ratio. Advantage may be taken of this increased signal-to-noise ratio to increase the resolution of the image, or to decrease the acquisition time using an acceleration method that uses the differential sensitivity between resonators due to their construction or distribution around the sample. In short, to improve the capacities and performance of an antenna array it is necessary to increase the number of resonators. However, this approach is effective only when the size of each resonator is kept the same; specifically, the coupling between the resonators and the nuclear spins occurs in the near field, and a decrease in the size of the resonators would lead to a decrease in the depth of penetration of the high-frequency field. Therefore, an increase in the number of resonators necessarily leads to a decrease in the distance between neighboring resonators, which leads to an increase in mutual coupling.

For a given transmission efficiency (or reception sensitivity), an increase in mutual coupling sees an increase in the transmission coefficient of the radiofrequency signal between the terminals (or RF ports) of neighboring resonators. A high mutual coupling has four main drawbacks: (i) it increases how difficult it is to bring each resonator into adjustment (frequency matching and impedance matching) as adjustment is then dependent on the adjustment of neighboring resonators; (ii) it leads to a loss of transmission efficiency because some of the injected power is dissipated in the load of the circulators of the RF chains or in the internal resistance of the power amplifiers that supply the neighboring resonators; (iii) it leads to an increase in reception noise because each resonator receives the noise due to its neighboring resonators; (iv) again in reception, it decreases in the effectiveness of the reconstruction algorithms used in parallel MRI.

Document [1] applies the theory of electrical circuits to the study of coupling between resonators. It proposes to decouple the resonators by interconnecting them by means of a reactive circuit of discrete elements. This solution presupposes a precise knowledge of the characteristics of the resonators and of their coupling coefficients, which is difficult—in particular in MRI in which the presence of the sample unpredictably modifies these characteristics. Furthermore, discrete reactive elements are difficult to use at high-frequency, introduce significant losses and do not easily withstand the high voltages used in multi-transmit MRI.

In practice, the resonators used in MRI may be split into two overall categories: linear resonators (a.k.a stripline resonators, see for example the reference [13]) and circular or loop resonators. Because of their geometric configuration, mutual coupling is lower between linear resonators, for a given number in a given space, compared to loop resonators. For this reason, the use of linear resonators is preferred in high-field MRI applications. For example, [6] describes an antenna for high-field MRI, in particular for acquiring images of the head, comprising a plurality of linear resonators arranged in a circle, so as to form a hollow cylinder.

Proposed solutions for decoupling loop resonators consist either in superposing them, or in placing a third circular resonator between two resonators. This second solution is proposed by [2].

In the case of linear resonators, decoupling is generally achieved using capacitors, see [3] and [4]. The drawbacks of this approach are of two orders. Firstly, this solution relies on the availability of capacitors, and preferably variable capacitors, that are capable of withstanding high voltages, of about a few kilovolts, and that introduce minimal losses. Next, the presence of parasitic reactances related to three-dimensional effects at high frequencies, generally above 300 MHz, greatly complicates the implementation of this approach. In any case, a decoupling device must endeavor to preserve as much as possible the intrinsic characteristics of a resonator, i.e. the characteristics measured in the absence of neighboring resonators.

Another approach that may be used to decouple two electromagnetic resonators consists in separating them with a periodic passive structure constructed according to the principles of meta-materials. This structure is placed so that once irradiated by an electromagnetic wave, it generates a magnetic field orthogonal to the propagation direction of the wave, identifiable by the Poynting vector; for this reason, the structure is generally called a "magnetic conductor (or wall)". The publication [5] describes the application of such a meta-material to the decoupling of two linear monopole resonators at 2.6 GHz; the publications [7] and [8], the international patent application [9] and the European patent [10] relate to its application to loop resonators for MRI. Meta-materials have the drawback of introducing high losses; moreover their structure is periodic, thereby limiting the ability to optimize the effectiveness of the decoupling in use. Furthermore, the design of a decoupling device based on meta-materials requires numerical simulations that are very complex, because such a device necessarily comprises a high number of objects (elementary resonators) of small size. Problems related to RAM capacity and to computing time are then encountered.

Documents [11] and [12] describe antenna arrays for MRI comprising two coplanar loop resonators separated by a space, and a decoupling resonator—also a loop resonator—arranged in this space with an orientation perpendicular to that of the two coplanar resonators, and therefore to the plane containing the latter. In contrast, the meta-materials proposed by [5] and [7]-[10] are made up of very small loop resonators lying in planes parallel to the plane containing the resonators to be decoupled. This decoupling technique, suggested for loop resonators, turns out to be unsuitable for linear resonators, as will be discussed below with reference to FIG. 14.

SUMMARY OF THE INVENTION

The invention aims to overcome the aforementioned drawbacks of the prior art by providing an antenna array comprising a plurality of linear electromagnetic resonators that have longitudinal axes parallel to one another, and passive decoupling devices arranged between these resonators. Each of these decoupling devices comprises a plurality of loop decoupling resonators, and, more precisely, a plurality of open-loop decoupling resonators, i.e. resonators including a loop interrupted by a capacitive element. These decoupling resonators are arranged in a plurality of planes that are not necessarily parallel to one another and that are substantially perpendicular, or in any case not parallel, to the plane containing two adjacent linear resonators (or, more exactly, their longitudinal axes)—and therefore to the Poynting vector of the electromagnetic wave radiated by each of the two linear resonators to be decoupled. Whereas the use of a single decoupling resonator of this type turns out to be ineffective in the case of an antenna based on linear resonators, the present inventors have realized that very effective decoupling may be obtained using a plurality of resonators arranged in a limited number of distinct planes. This decoupling device introduces a smaller amount of losses than a magnetic meta-material wall and, contrary to the latter, allows easy optimization of the decoupling via modification of the position and/or orientation of the decoupling resonators.

One subject of the invention is therefore an antenna array comprising a plurality of linear electromagnetic resonators having longitudinal axes oriented parallel to one another and not aligned, and at least one decoupling device arranged between two said linear electromagnetic resonators, characterized in that said decoupling device comprises a plurality of open-loop electromagnetic resonators that are matched to a frequency located in the bandwidth of the two said linear electromagnetic resonators, that are electrically insulated and that are arranged in a plurality of planes that are not parallel to a plane containing the longitudinal axes of the two said linear electromagnetic resonators.

Another subject of the invention is a nuclear magnetic resonance imaging apparatus comprising such an antenna array.

BRIEF DESCRIPTION OF THE DRAWINGS

Other features, details and advantages of the invention will become apparent on reading the description given with reference to the appended drawings, which are given by way of example and which show, respectively.

DETAILED DESCRIPTION

The following are the basic principles of the invention.

Between two transmitter and/or receiver resonators of an MRI antenna, mutual coupling is generally a result of the line integral of the magnetic field created by the excitation of the first, around the second, this line integral being taken along closed paths encompassing the second resonator. Thus, the passage of an electric current I through the first resonator induces a current I' such that |I'|<|I| in the second resonator by virtue of Lenz's law. The ratio I'/I determines the strength of the mutual coupling. When a decoupling device according to the invention is placed in the electromagnetic field radiated by the first resonator, it creates, in its turn, again by virtue of Lenz's law, a magnetic field the line integral of which along closed paths encompassing the second resonator generates a current I" in the latter of opposite direction to I'. Ideal decoupling is obtained when the algebraic sum of the currents I" and I' is zero. This condition requires a certain distribution in space of the magnetic fields associated both with the resonators to be decoupled and with the decoupling device itself. The implementation of a plurality of resonators, arranged in distinct planes, in the decoupling device allows a particular distribution of the magnetic field to be synthesized in order to modulate the amplitude of the current I". This modulation allows the decoupling to be easily and experimentally optimized during the development of the antenna array.

Figure 1A:
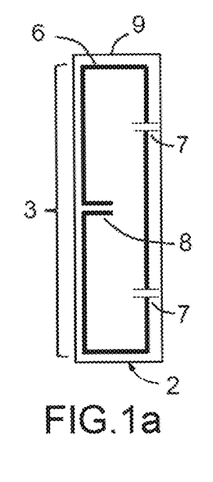
FIGS. 1a to 1e, five possible arrangements of decoupling resonators on planar carriers.
Figure 1B:
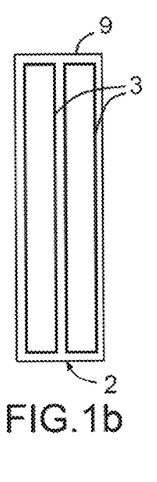
Figure 1C:
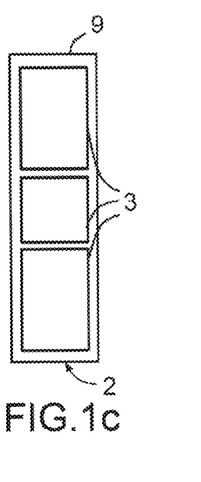
Figure 1D:
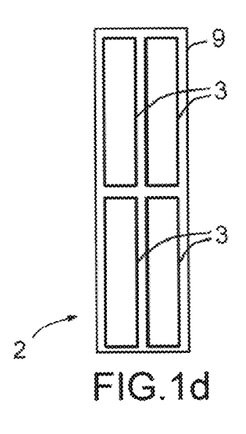
Figure 1E:
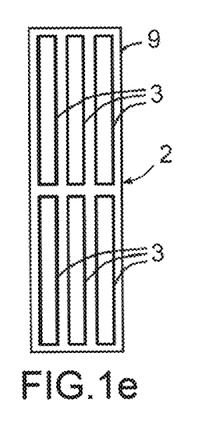

A decoupling device 1 according to the invention is formed by grouping together identical patterns 2. Each pattern, of planar shape, includes a plurality of open-loop decoupling resonators 3, the number of which in each of the two directions of the plane will be optimized depending on the configuration of the resonators to be decoupled. FIGS. 1*a* to 1*c* show patterns 2 comprising 1 (FIG. 1*e*), 2 (FIG. 1*b*), 3 (FIG. 1*c*), 4 (FIGS. 1*d*) and 6 (FIG. 1*e*) decoupling resonators each.

These decoupling resonators 3 are devoid of direct electrical connection therebetween or with any other component of the antenna.

According to one preferred embodiment of the invention, each resonator 3 is formed by a conductive track 6, for example made of copper, which turns inward onto one or more capacitors that are either discrete capacitors 7 and/or distributed capacitors 8. Because of the absence of direct electrical connection, the discrete capacitors 7 are not subjected to high voltages. The facing track segments that form the distributed capacitors 8 may be shortened to adjust the resonant frequency of the resonator 3. This frequency must be close to the operating frequency of the resonators to be decoupled. Its optimal value may be set beforehand by numerical simulation or experimentally (heuristically): it must be located in the bandwidth of the resonators to be decoupled. Moreover, each decoupling resonator preferably has a characteristic length (for example, its largest linear dimension—its largest side length in the case of a rectangular geometry) of the same order of magnitude as the length of each of the linear resonators 4 to be decoupled. What is meant by that is that the characteristic length $L_D$ of each decoupling resonator is comprised between 0.1 and 10 times, and preferably between 0.2 and 2 times, the length Lr of the resonators 4 to be decoupled. Advantageously, the decoupling resonators 3 have an elongate (for example rectangular, or elliptical) shape with a longest side (or longest axis in the elliptical case) oriented parallel to the longitudinal axis L of the linear resonators to be decoupled 4.

Figure 2:
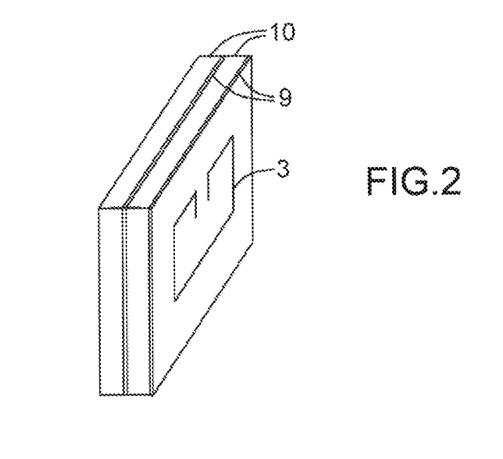
FIG. 2, two planar decoupling-resonator carriers connected via a rigid insert.

The decoupling resonators 3 may be produced using a printed-circuit technique on a carrier 9 that is rigid, typically the 0.8-mm-thick Rogers 4350 laminate, or flexible, typically a 50-micron thick polyamide film. A pattern is thus formed on a carrier 9 on which one or more resonators 3 are placed. In the case of a flexible carrier, a rigid insert 10, for example made of foam, must be added on either side of a pattern; an insert 10 may also serve to connect two patterns together (FIG. 2). The materials from which the carrier 9 and the insert 10 are made must introduce minimal dielectric loss at the operating frequency.

Figure 19:
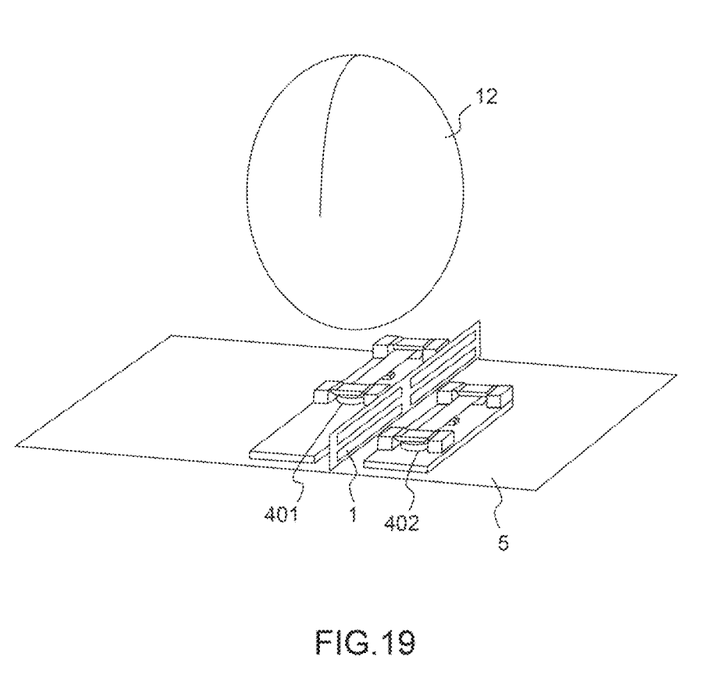
FIG. 19, the structure of a prototype antenna according to another embodiment of the invention.

As FIGS. 3*a* to 5*b* show, an antenna array according to the invention comprises at least two linear resonators 4 to be decoupled. These resonators 4 are parallel to one another, i.e. they have longitudinal axes L that are parallel to one another. In the embodiments of FIGS. 3*a* to 5*b*, they are placed side by side, shifted in a direction perpendicular to their common longitudinal direction (another possible configuration is illustrated in FIG. 19 and will be discussed below). They are separated by a distance that is generally very small with respect to the wavelength ($\lambda$) in air of the electromagnetic radiation that they emit. For example, this distance may be comprised between 1% and 15% of $\lambda$. Their length, in contrast, is generally close to $\lambda/4$, and typically comprised between $\lambda/8$ and $\lambda$ and preferably between $\lambda/8$ and $\lambda/2$.

Preferably, these resonators 4 are arranged above a ground plane, or shield, 5. The decoupling device 1 is arranged between the two resonators 4 to be decoupled, on the same side of the ground plane 5 as said resonators.

The various patterns 2 of the decoupling device 1, which are generally between 2 and 10 in number, and preferably between 3 and 6 in number, are arranged in distinct planes. Below, for the sake of simplicity, no distinction will be made between a pattern 2 and its plane, which will also be designated by the reference 2. These planes may be parallel to one another and perpendicular to the plane (reference pr in FIG. 3*b*) that contains the longitudinal axes L of the resonators 4. More particularly, in the case considered here, in which the resonators to be decoupled 4 are arranged side-by-side (without longitudinal shift), the planes of the patterns 2 are also perpendicular to the axis (reference a1 in FIG. 3*a*) that joins the centers of the resonators to be decoupled, this axis moreover being parallel to the Poynting vector of the electromagnetic field emitted by each of the resonators 4. More generally, the planes 2 may be inclined with respect to the plane pr, and make to the latter an angle that is generally comprised between 10° and 170° and preferably between 45° and 135°. In this case, it is not necessary for all the planes 2 to be parallel to one another.

FIGS. 3*a* to 3*e* illustrate various embodiments in which the planes of the patterns are parallel to one another and perpendicular to the plane pr and to the axis a1.

Figure 3A:
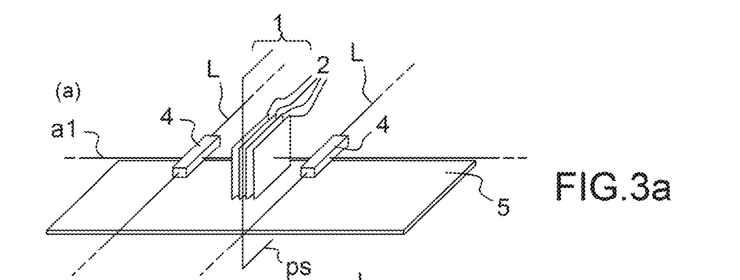
FIGS. 3a to 3e, 4a, 4b, 5a and 5b, various configurations of a decoupling device according to respective embodiments of the invention.

In the case of FIG. 3*a*, four patterns 2 are arranged perpendicular to the plane pr and to the axis a1; they are equidistant from one another and located at the same height with respect to the ground plane 5, which is parallel to the plane pr.

Figure 3B:
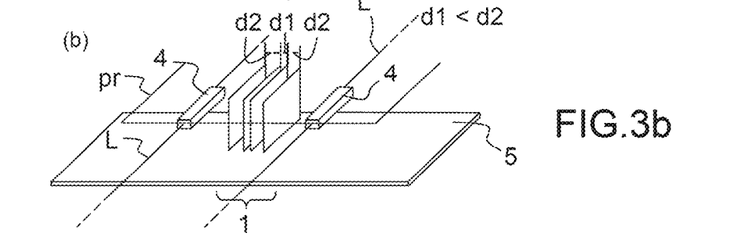

In the case of FIG. 3*b*, four patterns 2 are arranged perpendicular to the plane pr and to the axis a1, at the same height with respect to the ground plane 5, which is parallel to the plane pr. They are however not equidistant: the two middle patterns are separated by a distance d1 smaller than the distance (d2) that separates them from the end patterns.

Figure 3C:
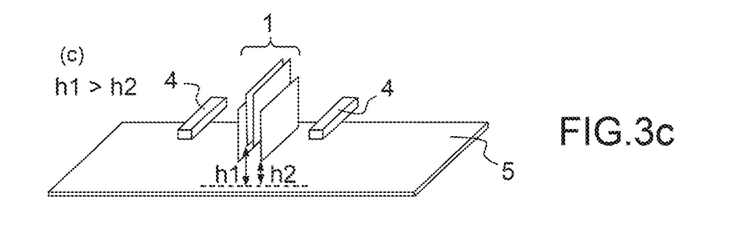

In the case of FIG. 3*c*, four patterns 2 are arranged perpendicular to the plane pr and to the axis a1, with the same spacing. The distance between the two middle patterns and the ground plane 5 (parallel to the plane pr), which is denoted h1, is larger than the distance (h2) between the two end patterns and the ground plane.

Figure 3D:
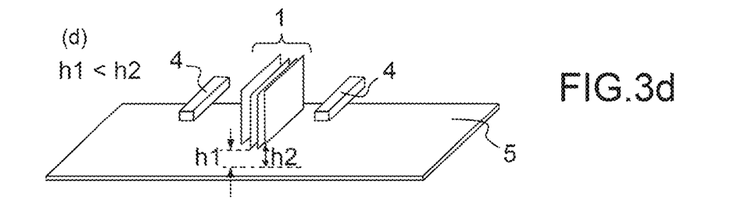

The case of FIG. 3*d* differs from that of FIG. 3*c* only in that h1<h2.

Figure 3E:
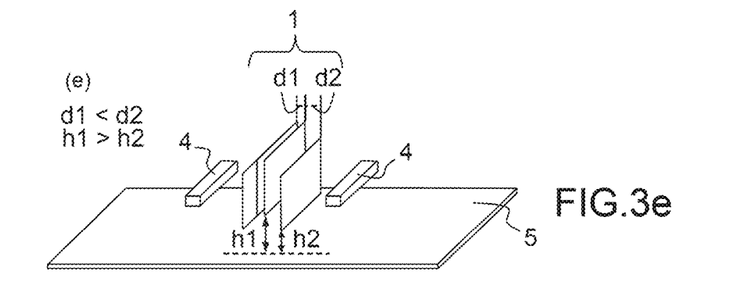

The case of FIG. 3*e* differs from that of FIG. 3*c* only in that the two middle patterns are separated by a distance d1 smaller than the distance (d2) that separates them from the end patterns.

Figure 4A:
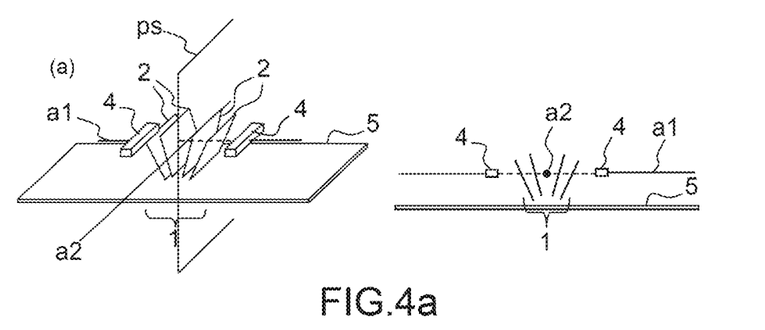
Figure 4B:
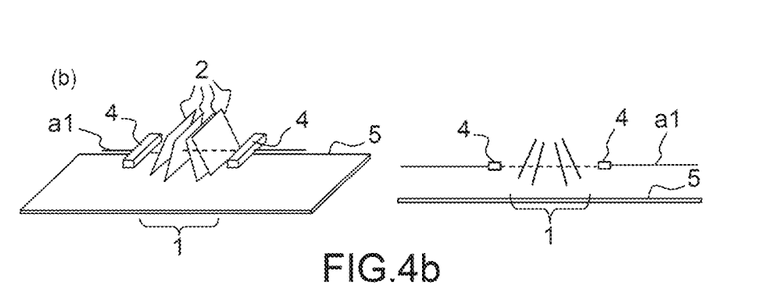

FIG. 4*a* shows a perspective view (left-hand part of the figure) and a cross-sectional view (right-hand part of the figure) of one embodiment in which the four patterns 2 are neither perpendicular to the axis a1 or to the plane pr, nor parallel to one another, but are open "like a book" with the most spaced-apart sides oriented upward (opposite to the ground plane 5). With respect to the configurations in FIGS. 1a-1e, the planes may be considered to be turned about an axis a2 (shown only in FIG. 4a) parallel to the longitudinal axes L of the resonators 4 to be decoupled, and therefore parallel to the ground plane 5 and perpendicular to the plane pr and to the axis a1. FIG. 4b shows the inverse configuration, in which the most spaced-apart sides of the patterns 2 are oriented toward the ground plane 5.

Figure 5A:
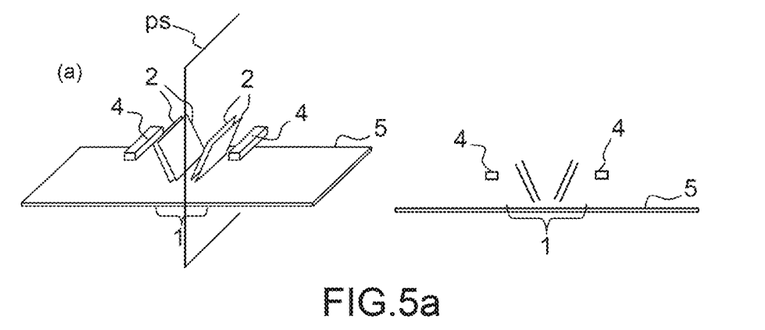
Figure 5B:
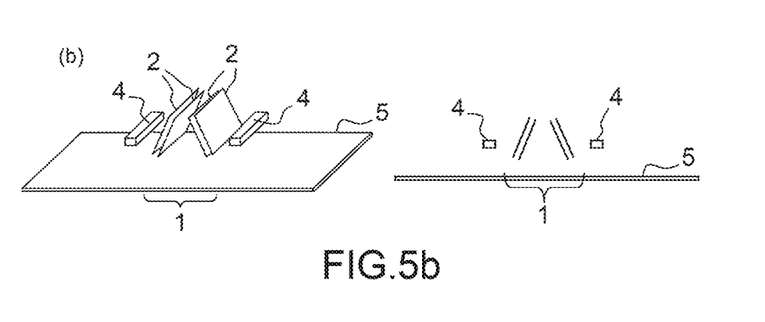

The configurations of FIGS. 5a and 5b differ from those of FIGS. 4a and 4b in that the patterns are parallel in pairs. They may moreover be joined, in pairs, to rigid inserts 10 (see FIG. 2).

In all the embodiments illustrated in FIGS. 3a to 5b, the patterns 2 and the resonators 4 to be decoupled are arranged symmetrically with respect to a plane ps, perpendicular to the plane pr and to the axis a1. This plane ps is schematically illustrated only in FIGS. 3a, 4a and 5a.

These configurations are given only by way of nonlimiting example. Other configurations are possible, for example configurations that are not symmetric with respect to the plane ps.

Advantageously, the position of the patterns 2 with respect to the antennas may be easily adjusted, so as to optimize the decoupling effect. This adjustment may consist in a movement and/or a rotation of the decoupling device 1 in its entirety, but preferably at least certain patterns 2 will be able to be moved, or rotated, independently of the others. This will be described below with reference to FIG. 7.

All the parameters of the invention: shape and number of the decoupling resonators 3, their relative arrangement, the position of the device 1 in its entirety, etc. may be determined either by numerical calculations with commercially available simulation codes, or via a heuristic approach.

Figure 6:
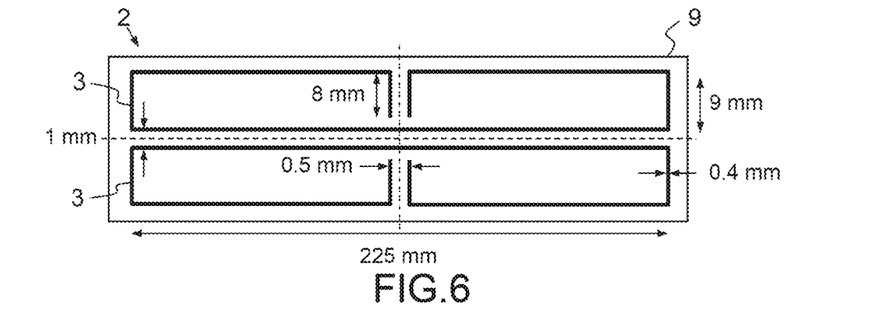
FIG. 6, an example of a decoupling resonator for a 7 T MRI antenna.

A proof of concept of the invention is provided for a simplified antenna operating in a 7 T (teslas) proton MRI scanner. To this end, a stack of three patterns 2 was used; FIG. 6 shows the structure and the dimensions of each of these patterns 2, comprising two decoupling resonators 3. The device 1 thus formed has the following dimensions: 19 mm×225 mm×5.7 mm. In the scanner (MRI apparatus) used for the experimental demonstration, the Larmor frequency of the proton is 297.2 MHz. These patterns thus dimensioned are used to decouple linear resonators 4, also referred to as "dipoles"—see for example [6].

Figure 7:
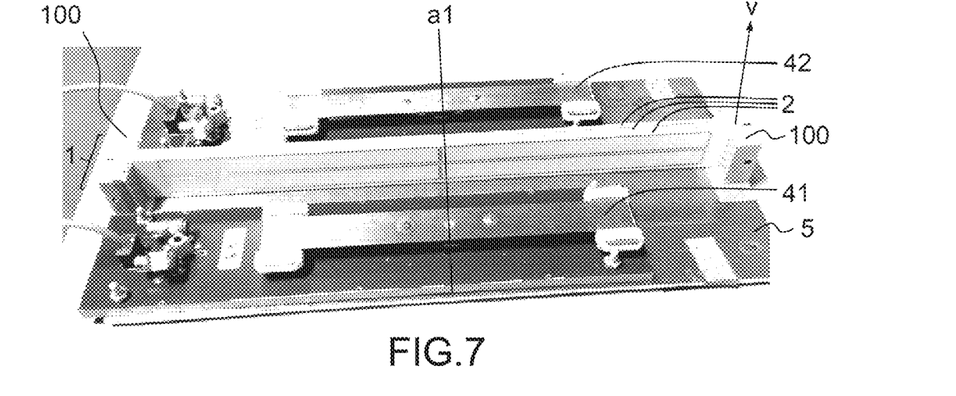
FIGS. 7 and 16, two photographs of two prototype antennas according to respective embodiments of the invention.

FIG. 7 shows the device 1 arranged between two dipoles 41, 42. Grooved holders 100 at the ends of the device 1 allow the patterns 2 to be held in place. By choosing the groove of each holder 100 in which the ends of a pattern 2 are inserted, it is possible to adjust (discretely) its position along the axis a1. A pattern 2 may also be slid along the grooves so as to adjust its vertical position (direction "v") and therefore its distance from the ground plane 5. It would also be possible to provide oblique grooves so as to allow a (discrete) adjustment of the inclination of the patterns 2 with respect to the plane pr (not shown) and to the axis a1; in the case of FIG. 7, however, these oblique grooves are not shown and the patterns 2 are perpendicular to pr and to a1. It is not difficult to envision other mechanical systems for fastening patterns allowing their position to be adjusted with at least some of these degrees of freedom (position along a1 or, more generally, a direction perpendicular to the longitudinal axes L of the resonators 4; position in the direction v; inclination with respect to the plane pr).

Figure 8A:
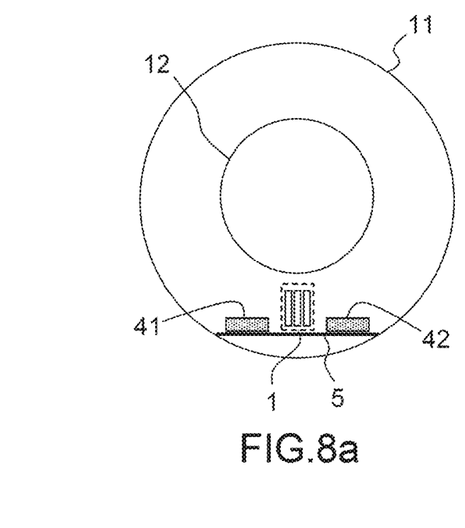
FIGS. 8a and 8b, a prototype MRI antenna according to one embodiment of the invention, with therein a phantom simulating a head.
Figure 8B:
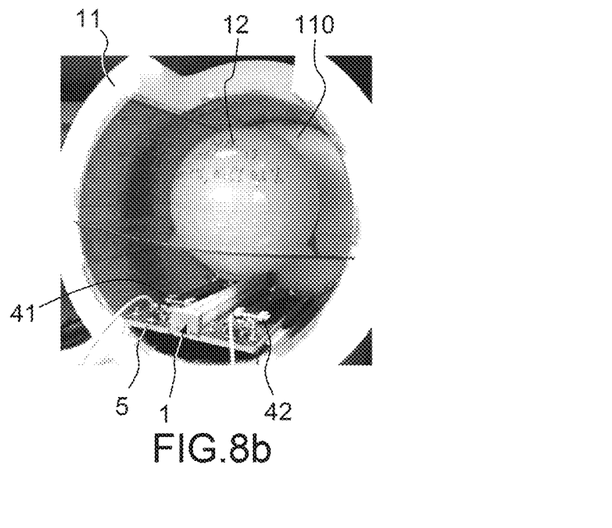

The assembly formed by the two dipoles 41, 42, the decoupling device 1 and the ground plane 5 is positioned in a shielded shell 11 defining a cavity 110 containing a spherical test phantom 12 of 78 mm radius, filled with an agar jelly the electrical properties of which are close to those of an organic tissue: dielectric constant =74.2; electrical conductivity =0.87 S/m (see the schematic of FIG. 8a and the photograph of FIG. 8b). This assembly forms a simplified antenna; an actual antenna array in MRI of the human head generally includes at least 8 dipoles encircling the cavity 110.

Figure 9:
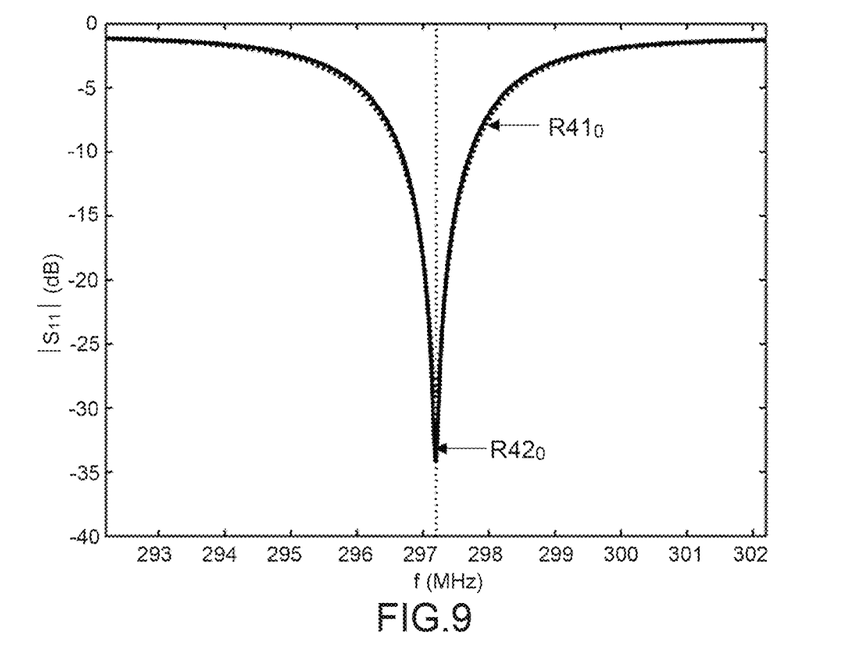
FIGS. 9 to 12, 14, 15 and 17, graphs illustrating the technical effect of the invention.

The curves in FIG. 9 show the reflection coefficients (modulus of the parameter $S_{11}$ of the scattering matrix) of each dipole placed alone in the shielded shell 11, without its neighbor, as a function of frequency f. The dotted curve $R41_0$ corresponds to the dipole 41, and the solid curve $R42_0$ to the dipole 42. Since the dipoles are nominally identical, and isolated, the two curves are very similar.

Figure 10:
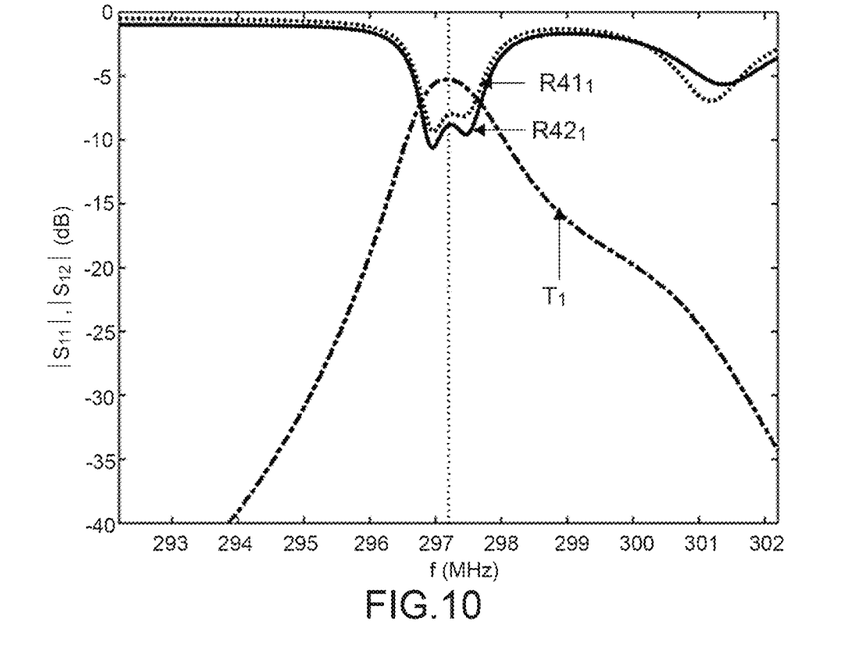
Figure 11:
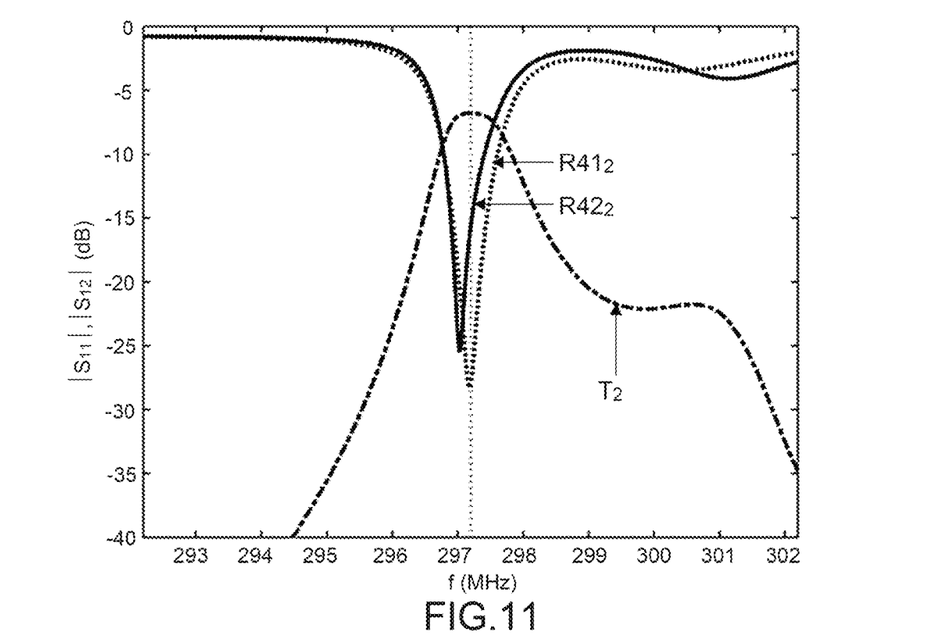
Figure 12:
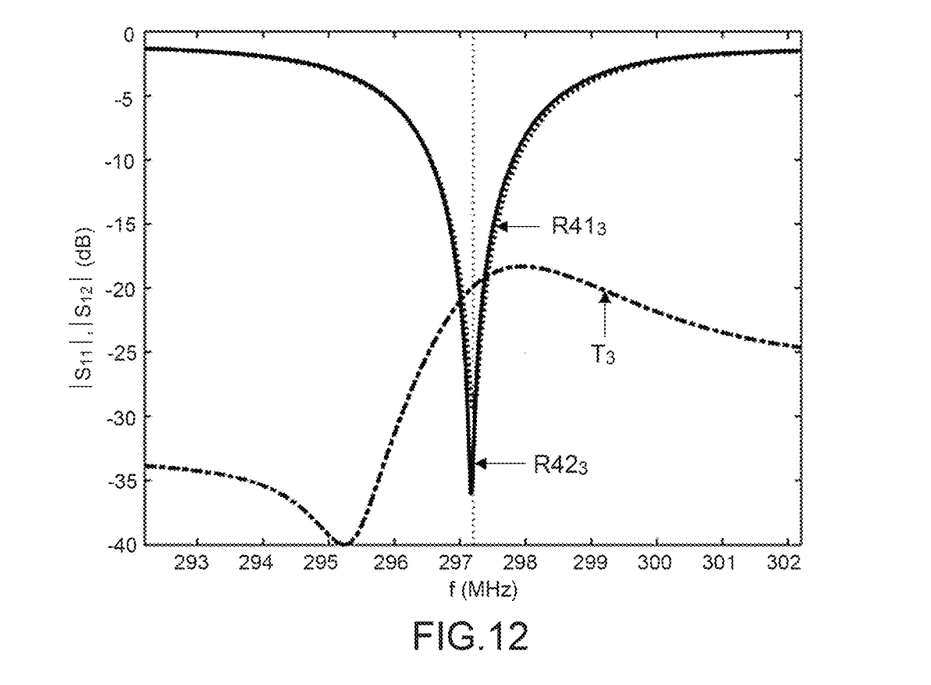

The dipoles 41 and 42 are very well impedance matched, the reflection coefficients are −29 dB and −34 dB for each of the dipoles. When the latter are both positioned at 7.6 cm from one each other, center to center, in the shell 11 without the decoupling device 1, the reflection coefficients, which were about −30 dB in the case where each dipole was considered individually, pass to a value of about −8 dB at the Larmor frequency (FIG. 10, curves $R41_1$, $R42_1$). In addition, the mutual coupling $|S_{12}|$, i.e. the transmission (curve $T_1$) between the two dipoles increases to −5 dB, this meaning that more than a quarter of the power able to be transmitted by one of the dipoles is lost in the dissipative load of the circulator to which each dipole is connected. The high coupling between the two dipoles 41, 42 makes two resonances appear about the Larmor frequency. In practice, a passive circuit composed of capacitors and inductors allows each dipole 41, 42 to be readjusted in order to minimize the power reflected at the Larmor frequency. In contrast, the coupling between the radiating elements remains very high; the transmission coefficient is still −7 dB (FIG. 11, curves $R41_1$, $R41_2$, $T_2$). The addition of the decoupling device 1 allows the transmission and reflection coefficients to be modified simultaneously. The reflection coefficient $|S_{11}|$ of each dipole 41, 42 is only very slightly modified with respect to the adjustment achieved when each dipole is considered alone, and the transmission coefficient $|S_{12}|$ between the two dipoles (4) is much lower (FIG. 12, curves $R41_3$, $R42_3$, $T_3$), it passes from −7 dB to −20 dB. A 13 dB improvement in isolation is thus observed. It will be noted that this performance is obtained with a 3-pattern decoupling device, with the latter placed 1 mm above the shield 5. If the number of patterns were 2 instead of 3, the observed improvement would be only 7 dB. Similarly, if the device 1 were 3 mm above the shield 5 a similar decrease in the improvement in the isolation would be observed. In contrast, if the position of the device 1 heightwise with respect to the dipoles 41, 42 were not limited by the floor formed by the shield 5, a greater improvement in isolation would be possible.

The effectiveness of the decoupling being demonstrated by the measurement of the transmission between the two dipoles 41, 42, it remains to be seen whether the magnetic field radiated by each of these dipoles in the presence of the decoupling device 1 remains comparable to the field that it would radiate if it were alone in the simplified antenna. In MRI, the circular-polarization component of the magnetic field that rotates in the same direction as the spins of the protons may be measured indirectly. Specifically, this component is proportional to the flip angle of the spins; certain dedicated sequences allow this angle to be measured.

Figure 13:
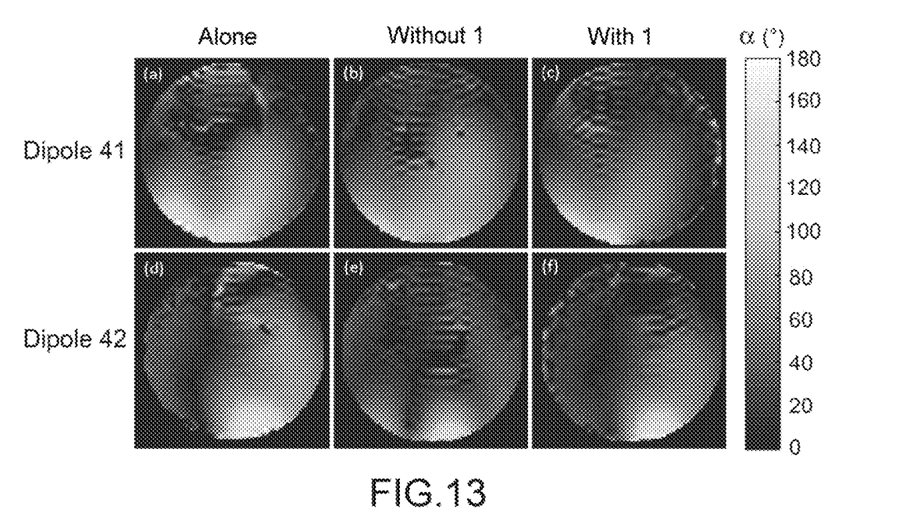
FIG. 13, maps of the flip angles of the nuclear spins of the phantom of FIGS. 8a-8b.

FIG. 13 shows the flip angles α of the spins of protons at the center of the phantom in the plane perpendicular to the largest dimension of the decoupling device in the 3 relevant configurations: dipoles considered alone ((a) and (d)), dipoles side-by-side without the decoupling device 1 ((b) and (e)), and dipoles side-by-side with the decoupling device 1 ((c) and (f)). The striated zones correspond to low flip angles at which measurement artefacts are more prevalent. Comparison shows that the decoupling device 1 plays its role well, i.e. that the angles associated with the radiated field (c) and (f) are much more like (a) and (d), whereas the angles (b) and (e) differ therefrom quite clearly.

Figure 14:
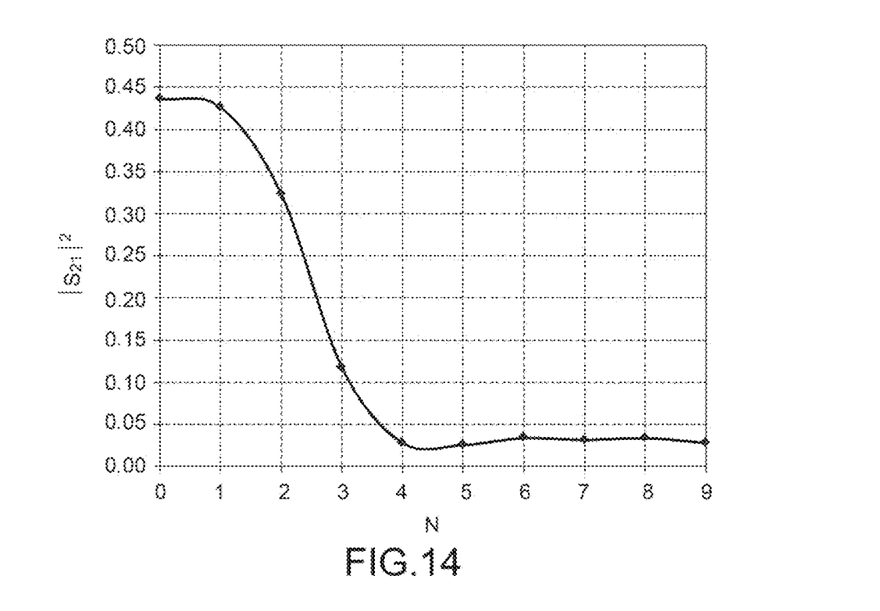

It is important to underline that the decoupling effectiveness, measured by the power transmission coefficient $|S21|^2$ between the two resonators 41 and 42 varies nonlinearly and in a way that is not obvious with respect to the number N of patterns of the decoupling device. This is illustrated in FIG. 14; it may be seen that the isolation is almost zero if a single pattern is used, increases very substantially with two—and above all three—patterns, then increases no more (or even decreases slightly) with more than four patterns. Of course, the optimum number of patterns may vary depending on the configuration in question, but is generally comprised between 3 and 6.

Figure 15:
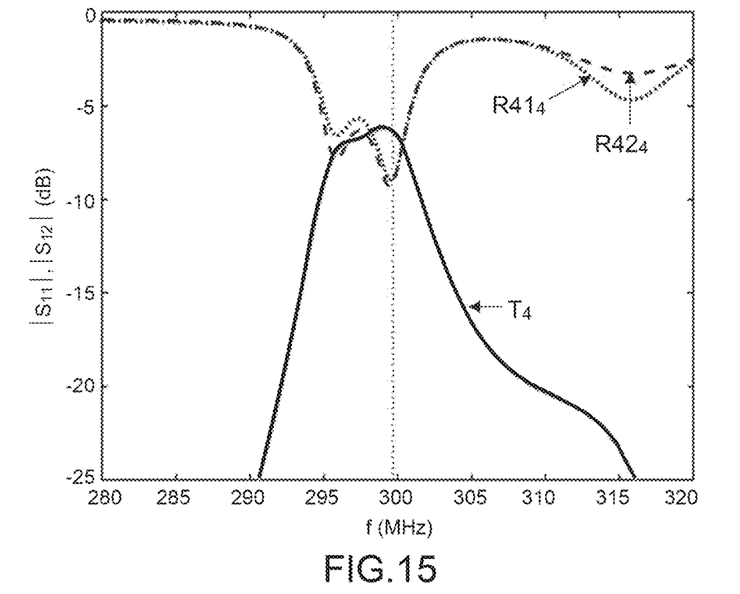
Figure 16:
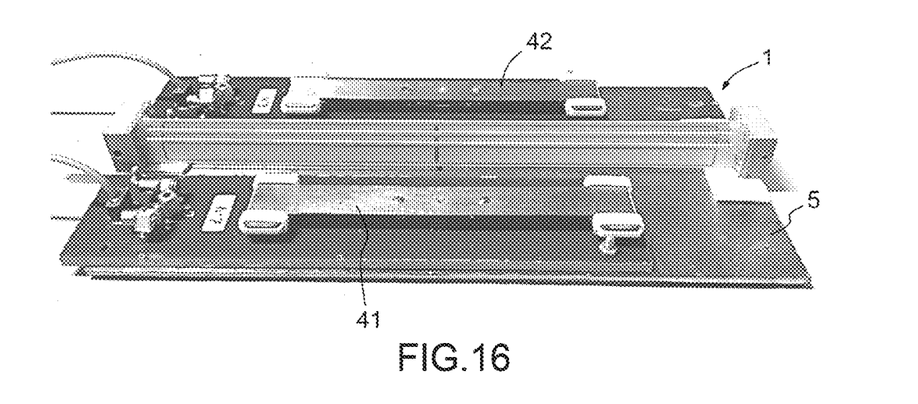
Figure 17:
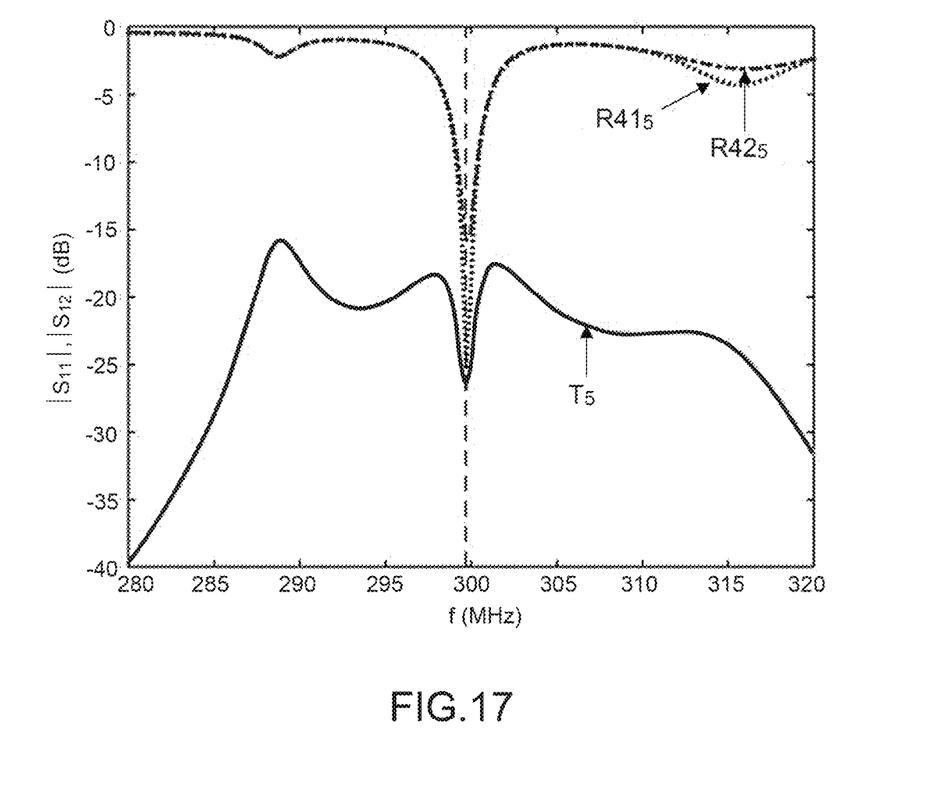

Another illustration of the particular properties conferred by the optimal arrangement in space of a plurality of patterns 2 was obtained by considering a simpler pattern 2 including only a single decoupling resonator 3, as shown in FIG. 1a. This resonator has the shape and dimensions indicated in FIG. 6, except that the second resonator in mirror symmetry with respect to the first was removed. The curves of the reflection and transmission obtained with a single pattern are shown in FIG. 15 (curves $R41_4$, $R42_4$, $T_4$). The measurement was carried out in the configuration of FIG. 8, i.e. in the presence of the phantom 12 and in the interior of the shell 11. The effectiveness of the decoupling is very low with a single pattern. The curves $R41_4$, $R42_4$, $T_4$ are very similar to the curves $R41_1$, $R42_1$, $T_1$ of FIG. 10, which were obtained without the decoupling device 1. In contrast, the same pattern 2 repeated five times in a configuration derived from that of FIG. 3c and illustrated in FIG. 16 (the two patterns closest to the resonator 42 cannot be seen) forms a particularly effective device 1, as the curves $R41_5$, $R42_5$, $T_5$ of FIG. 17 show.

Figure 18A:
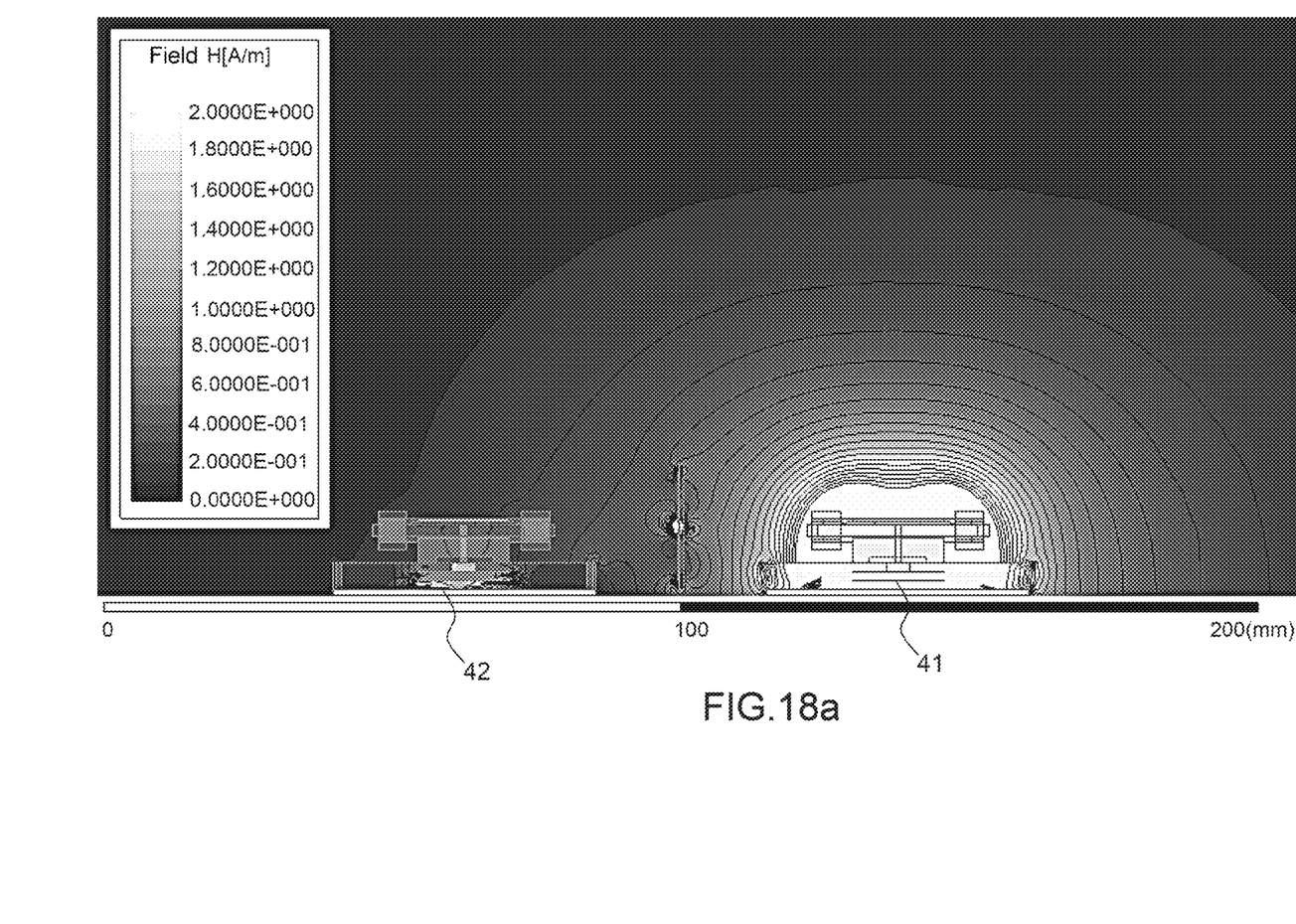
FIGS. 18a and 18b, magnetic-field maps illustrating the operation of a decoupling device according to the invention.
Figure 18B:
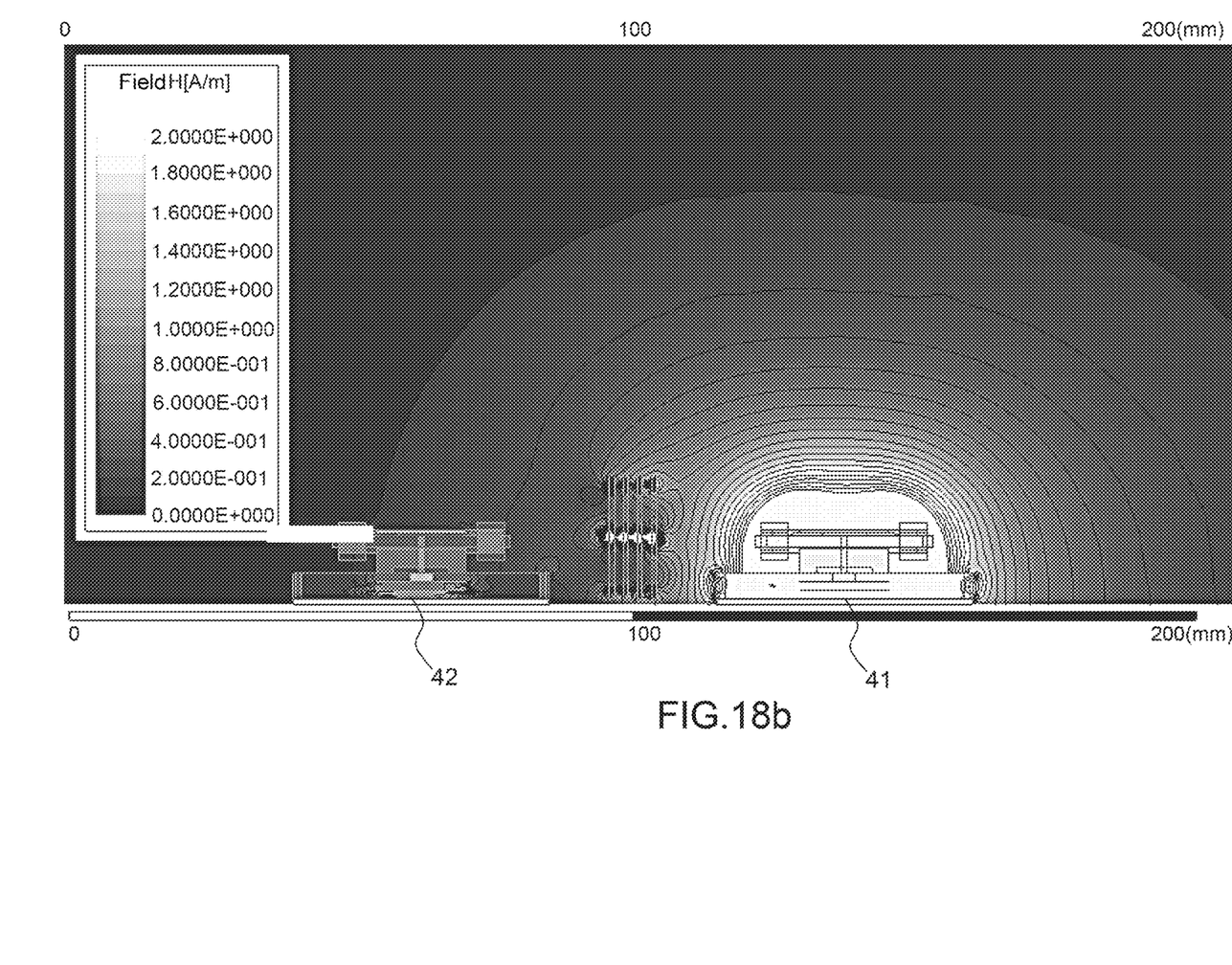

Numerical simulations allow it to be shown that the effectiveness of the decoupling device according to the invention is obtained through a redistribution in space of the magnetic field radiated by a resonator 41, which may be thought of as a channeling effect. Such a redistribution is made possible only by the presence of at least two patterns 2. FIGS. 18a/18b illustrate this channeling effect when 4 patterns 2 (FIG. 18b) are used instead of a single pattern (FIG. 18a); in both cases, only the resonator 41 is supplied with power, and it is the magnetic field generated by the latter in the resonator 42 that is of interest. These figures show the modulus and iso-value lines of the magnetic field H (in A/m) in a plane orthogonal to the main direction of the linear resonators 41 and 42, said plane being located 15 mm away from the distributed capacitors 8 of the pattern 2 in order to exclude the very local effects of the latter on the redistribution of the field. The field shown was calculated using the software package Ansys HFSS, which is based on the finite-element method, with as faithful as possible a reproduction of the objects used in the experimental setup. It is thus possible to observe therein, on the one hand, a rapid variation of the magnetic field in the various directions of the plane, and on the other hand, the appearance of a magnetic-field "channel" the length of which increases with the number of patterns. In the absence of this channeling effect, the magnetic field generated by the decoupling resonators 3 will be too low to generate, in the resonator 42, a sufficient induced current I" to cancel out the current I' induced directly by the magnetic field emitted by the resonator 41.

The invention has been described with reference to a certain number of embodiments, but variants are possible. For example, it is not indispensable for the decoupling resonators to be strictly identical to one another. Likewise, the linear resonators to be decoupled may be different from each other. Furthermore, it is possible for the linear resonators to be decoupled to be shifted along their longitudinal axes L, which remain parallel; it is then necessary for the decoupling device to extend over the cumulative length of the two linear resonators to be decoupled. This configuration is shown in FIG. 19, in which the axially shifted resonators are referenced by the references 401 and 402. It will be noted that, in this case, the spatial orientation of the decoupling patterns is defined with respect to the plane pr and not with respect to the axis a1, which becomes less relevant.

Furthermore, the ground plane may not be parallel to the plane pr; it may be replaced by a nonplanar ground surface, for example one that is concave on the whole with respect to the resonators 4 and obtained by extruding a profile along the axis L.

REFERENCES

[1] Lee, R. F. et al. (2002), Coupling and decoupling theory and its application to the MRI phased array. *Magnetic Resonance Medicine,* 48: 203-213.

[2] US 2013/0271144 A1: Avdievich, N. I. et al. (2013), Magnetic-resonance transceiver-phased array that compensates for reactive and resistive components of mutual impedance between array elements and circuit and method thereof.

[3] US 2011/0312499 A1: Vaughan, J. T. et al. (2011), Coil Element Decoupling for MRI.

[4] Yan, X., & Zhang, X. (2015). Decoupling and matching network for monopole antenna arrays in ultrahigh field MRI, *Quantitative imaging in medicine and surgery,* 5(4), 546-551.

[5] Ferrer, P. J. et al. (2008), Decorrelation of two closely spaced antennas with a metamaterial AMC surface, *Microwave and optical technology letters,* 50(5): 1414-1417.

[6] WO 2011/098713 A1: Ferrand, G. et al. (2011) Résonateur linéaire d'une antenne haute fréquence pour appareil d'imagerie par résonance magnétique nucléaire.

[7] Connel I. R. O. et al. (2015) MRI RF Array Decoupling Method With Magnetic Wall Distributed Filters, IEEE Transactions on Medical Imaging, 34(4): 825-835.

[8] Connel I. R. O. et al. (2015) Design of a Parallel Transmit Head Coil at 7 T With Magnetic Wall Distributed Filters, IEEE Transactions on Medical Imaging, 34(4): 836-865.

[9] WO 2014/109757 A1: Menon R. et al. (2014) System and method for decoupling magnetic resonance imaging radio frequency coils with a modular magnetic wall.

[10] EP 1 269 211 B1: Young I. R. et al. (2007) Magnetic resonance imaging apparatus with means to screen RF fields.

[11] Y. Soutome et al. Vertical Loop Decoupling Method for Gapped Phased-Array Coils Proc. Intl. Soc. Mag. Reson. Med. 19 (2011) 1859.

[12] US 2011/0121834 A1: Y. Soutome et al. "High-frequency coil and magnetic resonance device" (2011).

[13] EP 2 757 385 A1 R. Yeun-chul et al. "Radio frequency coil for magnetic resonance" (2014).

The invention claimed is:

1. An antenna array comprising a plurality of linear electromagnetic resonators having longitudinal axes oriented parallel to one another and not placed on a common axis, and at least one decoupling device arranged between two said adjacent linear electromagnetic resonators, wherein said decoupling device comprises a plurality of open-loop electromagnetic resonators that are matched to a frequency located in the bandwidth of the two said adjacent linear electromagnetic resonators, that are electrically insulated from their environment and that are arranged in a plurality of respective planes that are not parallel to a plane containing the longitudinal axes of the two said linear electromagnetic resonators, each said open-loop electromagnetic resonator having a characteristic dimension of the same order of magnitude as the length of the two said linear resonators.

2. The antenna array as claimed in claim 1, wherein the planes in which said open-loop electromagnetic resonators are arranged make an angle comprised between 10° and 170°, and preferably between 45° and 135°, to said plane containing the longitudinal axes of the two linear electromagnetic resonators.

3. The antenna array as claimed in claim 1, wherein said decoupling device comprises a plurality of planar printed-circuit-board carriers, on each of which are produced between 1 and 6 said open-loop resonators.

4. The antenna array as claimed in claim 1, wherein said open-loop electromagnetic resonators are arranged in a number of planes comprised between 2 and 10 and preferably between 3 and 6.

5. The antenna array as claimed in claim 1, wherein said decoupling device comprises a mechanical fastening system allowing at least one modification of the geometry of said device, said modification being chosen from:
   a movement of at least one said open-loop electromagnetic resonator in a direction perpendicular to the longitudinal axes of the two linear electromagnetic resonators and lying in the plane containing these axes;
   a rotation of at least one said open-loop electromagnetic resonator about an axis parallel to the longitudinal axes of the two said linear electromagnetic resonators; and
   a movement of at least one said open-loop electromagnetic resonator in its plane, in a direction perpendicular to the longitudinal axes of the two said linear electromagnetic resonators.

6. The antenna array as claimed in claim 5, wherein said mechanical fastening system is configured to allow at least one said open-loop electromagnetic resonator to be moved or rotated independently of the others.

7. The antenna array as claimed in claim 1, also comprising a ground surface that on the whole is concave with respect to the two said linear electromagnetic resonators and obtained by extruding a profile along their longitudinal axes.

8. The antenna array as claimed in claim 1, wherein said decoupling device has a symmetry with respect to a plane perpendicular to said plane containing the longitudinal axes of the two linear electromagnetic resonators.

9. The antenna array as claimed in claim 1, wherein the two said linear resonators are identical.

10. The antenna array as claimed in claim 1, wherein each said open-loop electromagnetic resonator comprises a conductive loop interrupted by a discrete capacitor or a distributed capacitive element.

11. The antenna array as claimed in claim 1, wherein the two said linear electromagnetic resonators are arranged side-by-side, an axis joining their centers being perpendicular to their longitudinal axes.

12. The antenna array as claimed in claim 1, wherein the two said linear resonators are shifted both in a direction parallel to their longitudinal axes and in a direction perpendicular to said axes.

13. The antenna array as claimed in claim 1, comprising a plurality of said linear electromagnetic resonators oriented parallel to one another and adjacent pairwise, a said decoupling device being arranged between each pair of adjacent linear electromagnetic resonators.

14. The antenna array as claimed in claim 13, wherein said electromagnetic resonators encircle a cavity allowing a part of an animal or human body to be inserted.

15. A nuclear magnetic resonance imaging apparatus comprising an antenna array as claimed in claim 14.

* * * * *